(12) United States Patent
Rosenau et al.

(10) Patent No.: US 8,259,456 B2
(45) Date of Patent: Sep. 4, 2012

(54) ENVIRONMENTALLY SEALED INDUCTIVE SENSOR ASSEMBLY

(75) Inventors: Paul Rosenau, Santa Ana, CA (US); Charles J. Heiden, Mission Viejo, CA (US)

(73) Assignee: Balboa Water Group, Inc., Tustin, CA (US)

( * ) Notice: Subject to any disclaimer, the term of this patent is extended or adjusted under 35 U.S.C. 154(b) by 542 days.

(21) Appl. No.: 12/489,792

(22) Filed: Jun. 23, 2009

(65) Prior Publication Data
US 2010/0320066 A1 Dec. 23, 2010

(51) Int. Cl.
*H05K 5/00* (2006.01)
(52) U.S. Cl. ........ 361/752; 200/512; 200/513; 200/514; 200/515; 200/516
(58) Field of Classification Search .......... 200/512–520, 200/341, 181; 361/752
See application file for complete search history.

(56) References Cited

U.S. PATENT DOCUMENTS

| | | | | |
|---|---|---|---|---|
| 4,618,797 | A | * | 10/1986 | Cline ........................... 310/339 |
| 5,332,944 | A | * | 7/1994 | Cline ........................... 310/339 |
| 5,883,459 | A | * | 3/1999 | Cline et al. ..................... 310/339 |
| 7,205,775 | B2 | | 4/2007 | Kreit |
| 7,319,319 | B2 | | 1/2008 | Jones et al. |
| 2006/0232269 | A1 | | 10/2006 | Sills et al. |

OTHER PUBLICATIONS

Application Note AN1237, Inductive Touch Hardware Design, Microchip Technology, Inc. 2008.
Application Note AN1239, Inductive Touch Sensor Design, Microchip Technology, Inc., 2008.
Application Note AN1241, excerpt pp. 1-4, Inductive Touch Software Design, Microchip Technology, Inc., 2008.
Data Sheet, 74HC/HCT4053, Dec. 1990, Philips.

* cited by examiner

*Primary Examiner* — Tuan T Dinh
*Assistant Examiner* — Hung Dang
(74) *Attorney, Agent, or Firm* — Larry K. Roberts

(57) ABSTRACT

An exemplary embodiment of an inductive electrical sensor assembly includes a hollow housing structure defining an open space within the housing structure and a circuit board mounted in the open space. The circuit board includes an inductive sense area. A flexible metal domed spring structure is mounted over the inductive sensor area. A stem portion extends from a actuator area of the housing structure and having a distal end disposed adjacent to or in contact with the spring structure. The domed spring structure is adapted to be flexed toward the inductive sensor area by force exerted by the stem portion when a user exerts force on the actuator area, the flexing of the domed spring structure resulting in a change of inductance of the inductive sensor area which may be sensed to indicate an actuator push. An exemplary embodiment of the sensor assembly may include a resiliently deformable potting material substantially filling open spaces in the hollow housing structure between the top surface and the circuit board, and an open space below the circuit board, enabling flexure of the domed spring structure while providing environmental protection.

28 Claims, 6 Drawing Sheets

ENVIRONMENTALLY SEALED INDUCTIVE SENSOR ASSEMBLY

BACKGROUND

Electronic components are susceptible to corrosion damage by moisture, and it is common to encapsulate components such as transistors and even entire circuit boards to seal them off from corrosive environments. Encapsulating or potting materials for this purpose are well known in the art.

U.S. Pat. Nos. 4,618,797, 5,332,944 and 5,883,459 disclose switches useful in applications susceptible to moisture damage such as bathing installations. The switches may be used for remotely located controls for operating electrical equipment such as swimming pool or spa pumps, blowers and heater controls, and the like.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

Figure 1:
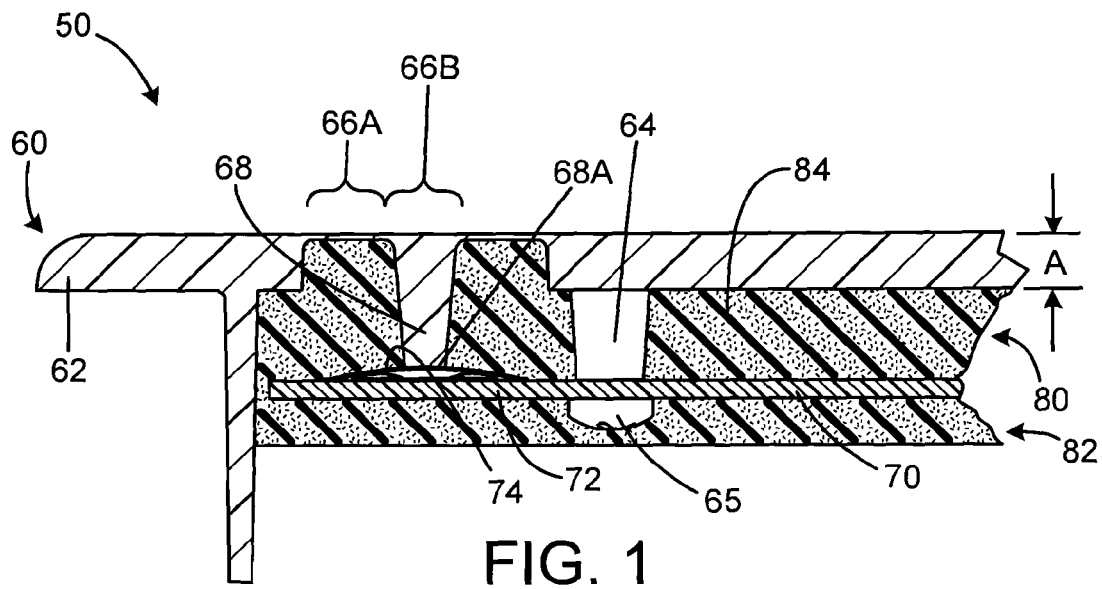
FIG. 1 is a diagrammatic side view illustrating features of an exemplary embodiment of an inductive sensor assembly.

In the following detailed description and in the several figures of the drawing, like elements are identified with like reference numerals. The figures are not to scale, and relative feature sizes may be exaggerated for illustrative purposes.

Figure 2:
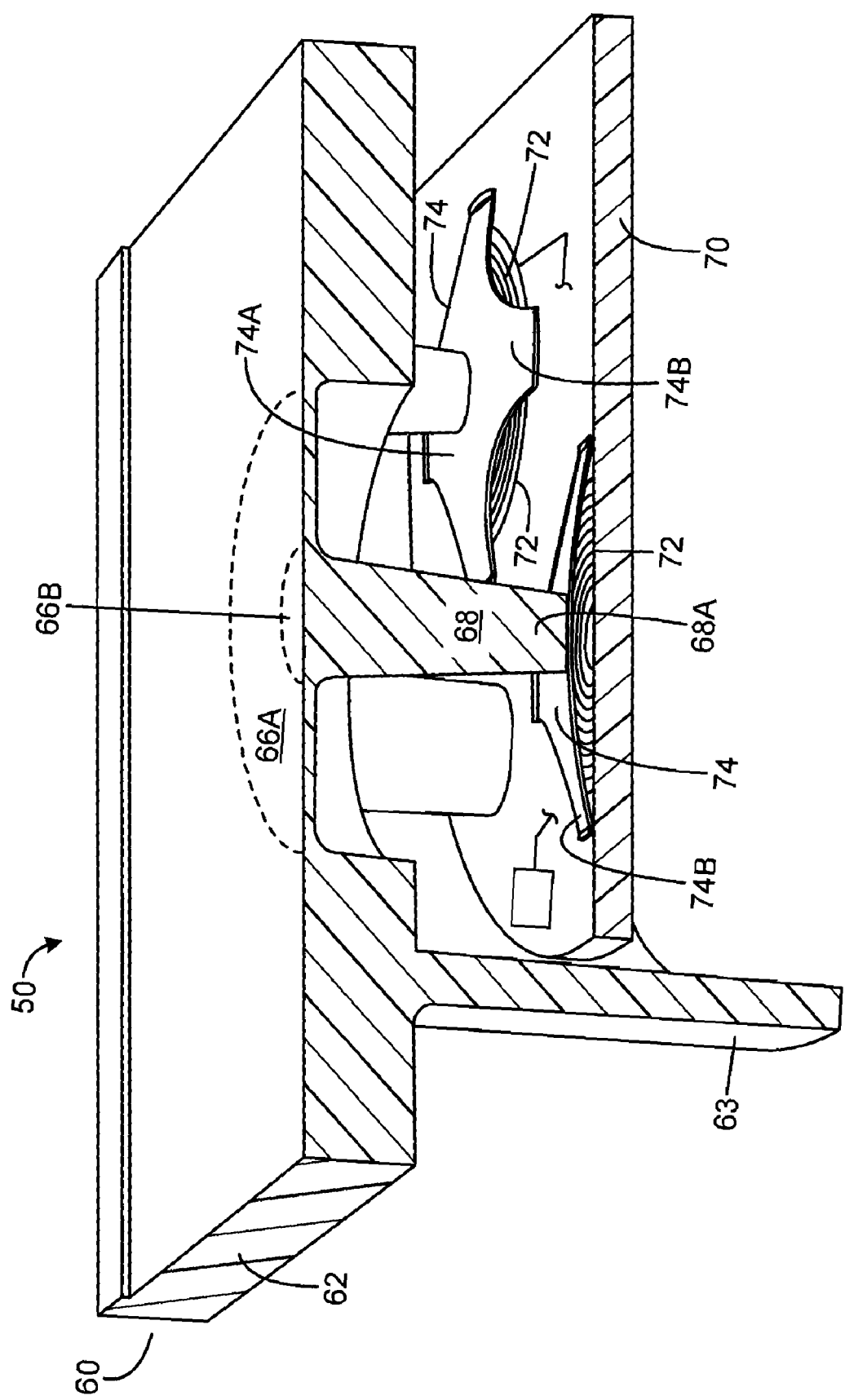
FIG. 2 is a partial isometric view of a control panel for a bathing installation.

An exemplary embodiment of a touch sensitive sensor assembly 50 is illustrated in FIGS. 1 and 2. The assembly includes a housing structure 60, which may be fabricated from a dielectric plastic material such as polycarbonate or a polycarbonate blend, such as FXD123R manufactured by Saudi Basic Industries Corporation, e.g. by molding. Other materials may alternatively be employed. The housing structure includes a top panel portion 62, which is generally of a thickness A (FIG. 1), with an annular region 66A having a reduced thickness. A boss portion 64 protrudes downwardly from a portion of the housing structure of thickness A to locate the circuit board 70. In some embodiments, a plurality of boss portions 64 will be employed to locate and secure the printed circuit board.

A stem portion 68 protrudes downwardly from the center or actuator portion 66B of the annular region of reduced thickness, and in a rest position the distal end 68A (FIG. 2) may contact without fully depressing a flexible metal domed spring structure 74, discussed more fully below. The thickness A and the reduced thickness of the annular region are selected to securely fix the printed circuit board 70 yet allow movement of the actuator portion 66B in relation to the top panel portion 62 as a result of a pressing force exerted by a user. Thus, in this exemplary embodiment, the top panel portion 62 of the housing structure is fabricated of a rigid material, which has areas of reduced thickness generally surrounding an actuator area to provide some limited flexibility in the panel at the actuator area. The movement of the actuator portion 66B may be quite small, e.g. on the order of 0.01 inch in an exemplary embodiment.

The assembly further includes a circuit board 70, which includes printed wiring conductor patterns including an inductive sensor area 72 fabricated on a top surface of the circuit board. The circuit board 70 is mounted to the housing structure 60 by attachment to the boss 64, e.g. by a screw 65. Typically at least two bosses and screws are used to attach the circuit board to the housing structure. Latching features in the plastic or other means could alternatively be used to attach the circuit board to the housing.

The circuit board assembly 70 further includes a flexible metal domed spring structure 74, attached to the top surface of the circuit board over the inductive sensor area. In an exemplary embodiment, a dome portion 74A of the spring structure overlaps the sensor area, but is not in contact with the sensor area.

The spring structure 74 also includes a plurality of contact feet portions 74B, at least one of which may be attached to the circuit board, to locate the dome portion 74A over the sensor area. One exemplary form of attachment is by soldering. In an exemplary embodiment, only one foot portion of the spring structure 74 will be attached to the circuit board, so that the overall flexibility of the spring is maintained. In the case in which there are four feet, the other three feet can rest on the circuit board surface, and are allowed to move or slide as the dome portion of the spring structure is depressed and released. Attaching all the feet to the circuit board would greatly increase the rigidity of the actuator press, i.e. requiring more force to actuate the sensor.

Figure 1A:
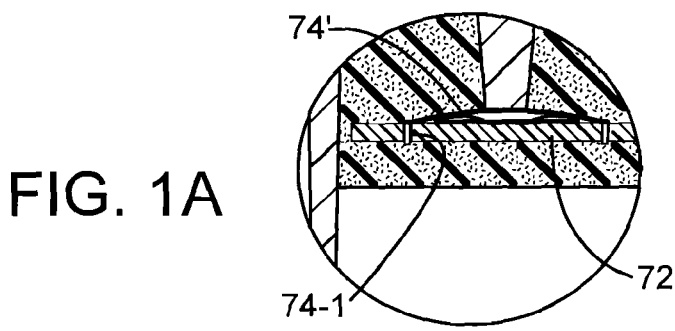
FIG. 1A is a fragmentary illustration showing an alternate embodiment of an attachment of a spring structure to a circuit board of an inductive sensor assembly.

One or more of the contact feet portions 74B may be soldered to a contact pad on the circuit board, and may be electrically connected to ground in an exemplary embodiment. The mounting of the spring structure 74 may also be accomplished with bent metal tabs that protrude from at least one of the contact feet, through the circuit board and hold the dome portion in place. In an exemplary embodiment, it is not necessary to electrically ground the spring structure 74 to provide a functional inductive sensor assembly. However grounding the spring structure may be advantageous in other embodiments in order to minimize electrical and/or broadcast noise effects on the sensor assembly. Soldering may be advantageous for production handling requirements. The attachment can alternatively be done with one or more tabs that protrude through the circuit board, as described above, holding the dome portion in place without solder. FIG. 1A illustrates this alternate embodiment, wherein the spring structure 74' has one or more tabs 74-1 protruding through holes formed in the circuit board 72 to hold the spring structure in place. Alternatively, other means for attaching the spring structure to the circuit board may be employed, such as adhesive or tape.

Spring structures suitable for use in the sensor assembly are commercially available, e.g. part numbers F16640N or F14400N, marketed by Snaptron, Inc. Spring domes have been employed as actual electrical switch contacts in traditional membrane switch assemblies, generally to produce a tactile "snap" effect and to create an electrical contact point at the same time. In contrast, this embodiment of an inductive sensor does not require an electrical contact or a tactile snap effect. Rather, the inherent flexibility of the spring structure is exploited in this embodiment.

As noted above, the stem portion 68 of the housing structure has a distal end 68A which is closely adjacent to or in contact with the dome portion of the spring structure 74.

The housing structure 60 provides an actuator area 66B, surrounded by the annular region 66A of reduced thickness. In operation, the user presses on the actuator area 66B, and the reduced thickness of the annular region allows some slight downward movement of the actuator area 66B, which in an exemplary embodiment is on the order of 0.010 inch. The stem portion 68 underlying the actuator region 66B is also pushed downwardly, exerting a force on the dome portion of the spring structure 74. The dome portion is deflected downwardly, bringing it closer to the sensor area 72 on the circuit board. This deflection changes the inductance of the sensor area, which may be detected by a suitable sense circuit and interpreted as an actuator push. Once the user removes pressure from the actuator area 66B, the spring force of the spring structure and the spring force inherent in the housing structure returns the spring structure and the stem to their rest or default positions, and the inductance of the sensor area changes back to a rest or default inductance state.

The housing structure 60 and circuit board 70 define open spaces 80 and 82 above and below the circuit board, which can be filled in an inverted position of the housing structure with a resiliently deformable potting means or gel 84 from a suitable filling device. The gel 84 is able to flow into spaces 80 and 82, and also fill the region between the dome portion 74A and the sensor region 72 on the circuit board.

The potting gel 84 in an exemplary embodiment is resiliently deformable, resistant to moisture, and may be selected for resistance to whatever harmful chemicals are anticipated in the operating environment. The degree of resilient deformability is preferably such that it will permit the desired deflection of the spring 74, but also sufficient to aid in returning the dome portion 74 and stem 68 to its undeflected state when the deflecting force is removed. The gel may be forced out from under the dome portion of the spring structure during an actuator press, and subsequently drawn back under the dome portion upon release of the actuator press.

A dielectric gel, marketed by Dow Corning as Dow Corning 3-4154 A and B, has been found to give good results as potting gel 84. It is a high dielectric substance and hydrophobic or resistant to water penetration. Other potting compounds may also be employed.

Figure 3:
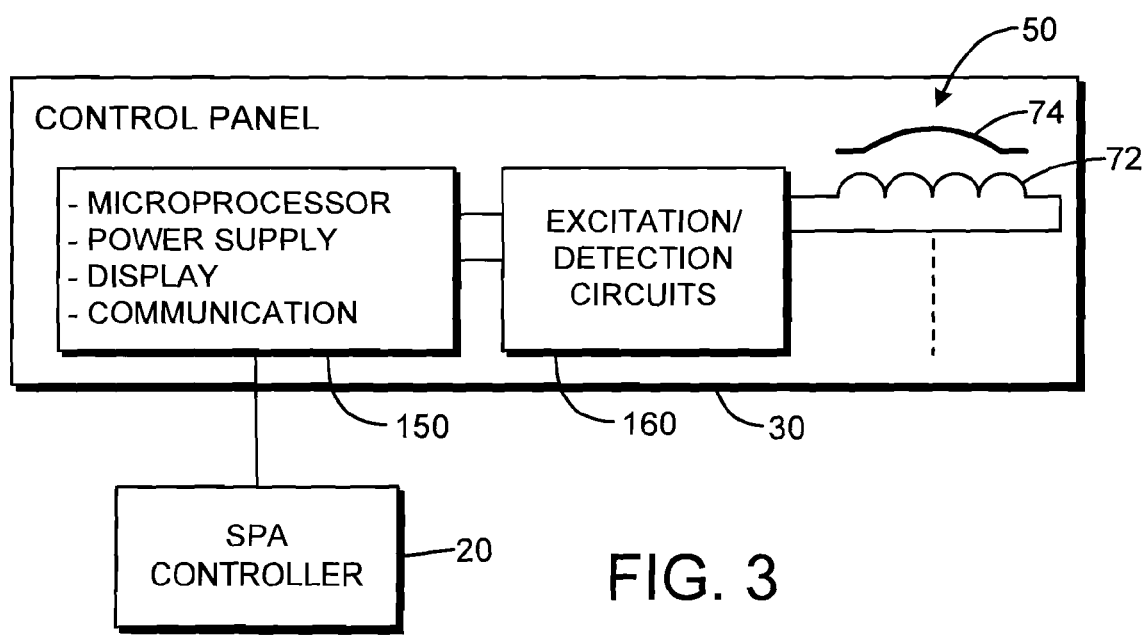
FIG. 3 is a simplified electrical schematic diagram illustrating a bathing installation control system employing an inductive sensor.

FIG. 3 depicts an exemplary simplified electrical schematic block diagram of a bathing installation employing a sensor assembly 50. In this case the sensor assembly 50 is incorporated in a control panel 30 connected to a bathing installation electronic controller 20. In an exemplary embodiment, the control panel includes a microprocessor-based controller, power supply, display and communication circuitry, generally designated by reference 150. Excitation and detection circuits 160 are connected to circuitry 150, and to the inductor sensor area 72. The excitation circuitry may provide an excitation drive signal, and the detection circuitry may sense or measure differences in the response of the inductor sensor area 72 to the drive signal. For example, the drive signal may be derived from a port of the microprocessor whose state is toggled low/high to create a square wave. The detection circuitry may sense differences in the impedance of the sensor caused by the user pressing the actuator area 66B on the sensor to depress the dome portion of the spring 74. A suitable excitation and sensing circuitry is described, as part of the Microchip "Inductive Touch Resource Kit." at www.microchip.com/stellent/idcplg?IdcService=SS_GET_PAGE&nodeId=2694&param=en538309.

A number of sensor assemblies can be located in a single control panel for placement next to a bathing installation, where it is readily accessible to a user. The user can then operate any one or more components by merely pressing the actuator area 66B associated with the particular spa component that is to be operated. The sensor assembly or assemblies are electrically isolated from the power circuits that actually operate the spa components so that there is no exposure of the user to shock hazards.

Figure 4:
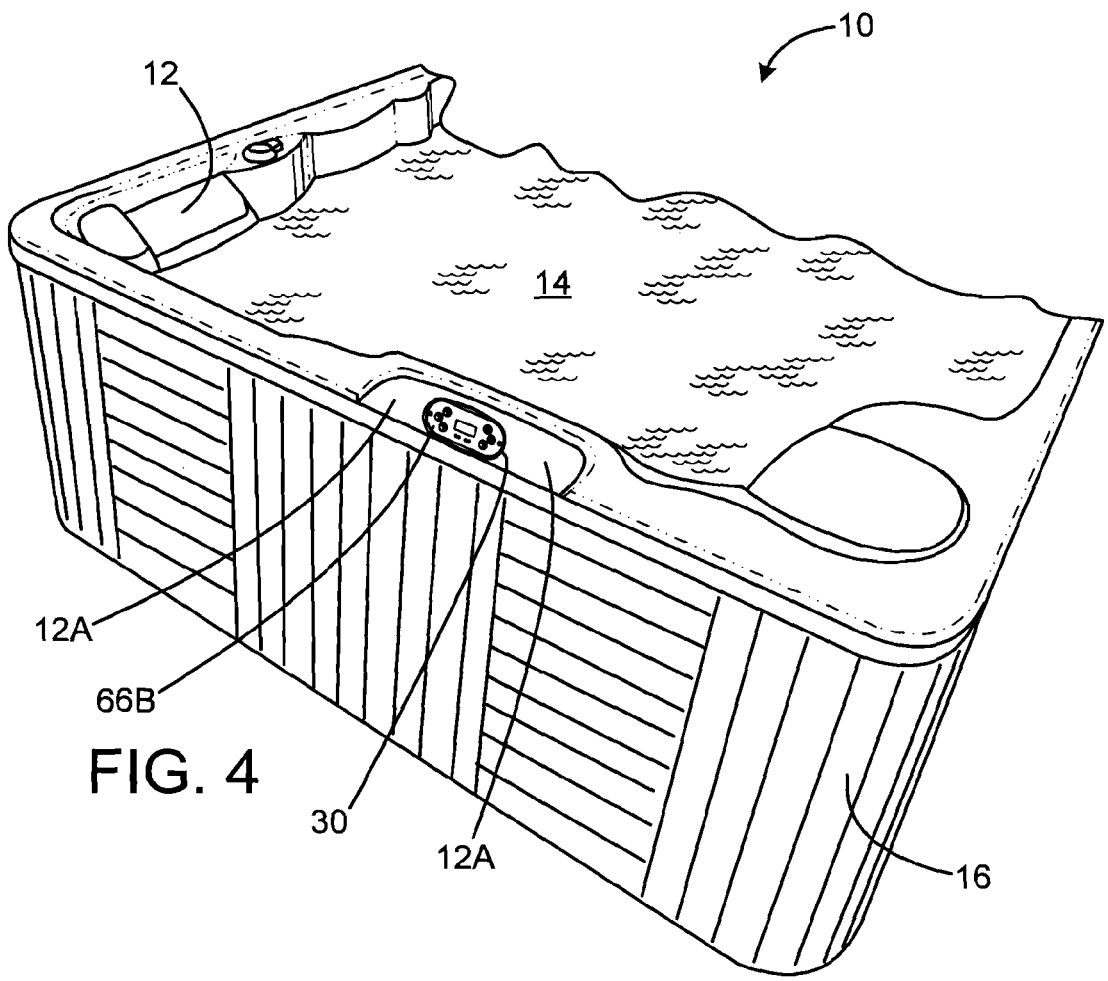
FIG. 4 is an isometric view of an exemplary bathing installation tub with an exemplary embodiment of a control panel mounted on a tub surface.

An exemplary bathing installation in which a sensor assembly as described above may be employed is a spa having a spa tub, although it will be appreciated that the subject matter may be practiced in connection with other bathing installations such as whirlpool baths and pools. FIG. 4 depicts a spa installation 10 including a tub 12 adapted to hold a volume of bathing water 14. The spa installation may include a side enclosure structure 16 which encloses the sides of the tub and equipment such as a heater, pump, blower and the like. An electronic control system may also be housed in a space between the spa tub and the enclosure structure.

In this exemplary embodiment, a control panel 30 is mounted to the tub wall at a location, e.g., on a tub wall top surface 12A accessible to a spa user. The panel 30 may include a display for displaying information to the spa user, e.g., alphanumeric characters and symbols, and tactile controls adapted to allow the spa user to control features of the spa, such as the water set temperature, the spa blower, lights and the like. The tactile controls may include one or more of the inductive sensor assemblies 50 as described above regarding FIGS. 1-3.

Figure 5:
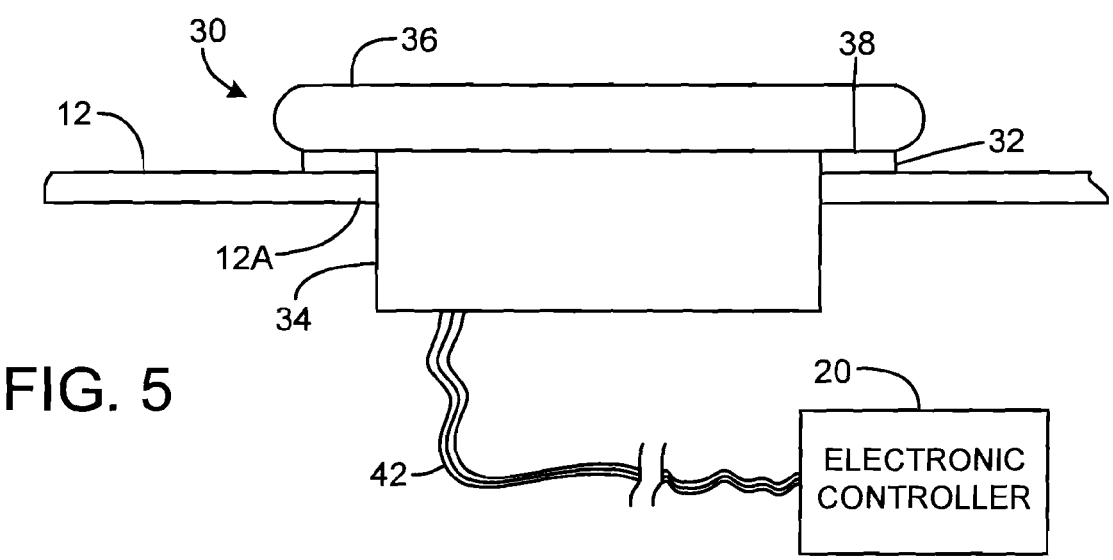
FIG. 5 is a cross-sectional view of the control panel and tub wall depicted in FIG. 4.

FIG. 5 diagrammatically depicts an exemplary embodiment of a spa control panel 30 with a housing 32 including a peripheral wall structure 34 and a top cover 36. The panel housing wall structure is installed through an opening formed in the tub wall 12A, and a flange portion 38 of the cover is attached to the edge of the tub wall surface surrounding the mount opening by an adhesive gasket 40. A wiring harness 42 is connected between the panel 30 and the electronic controller 20 of the spa installation.

Figure 6:
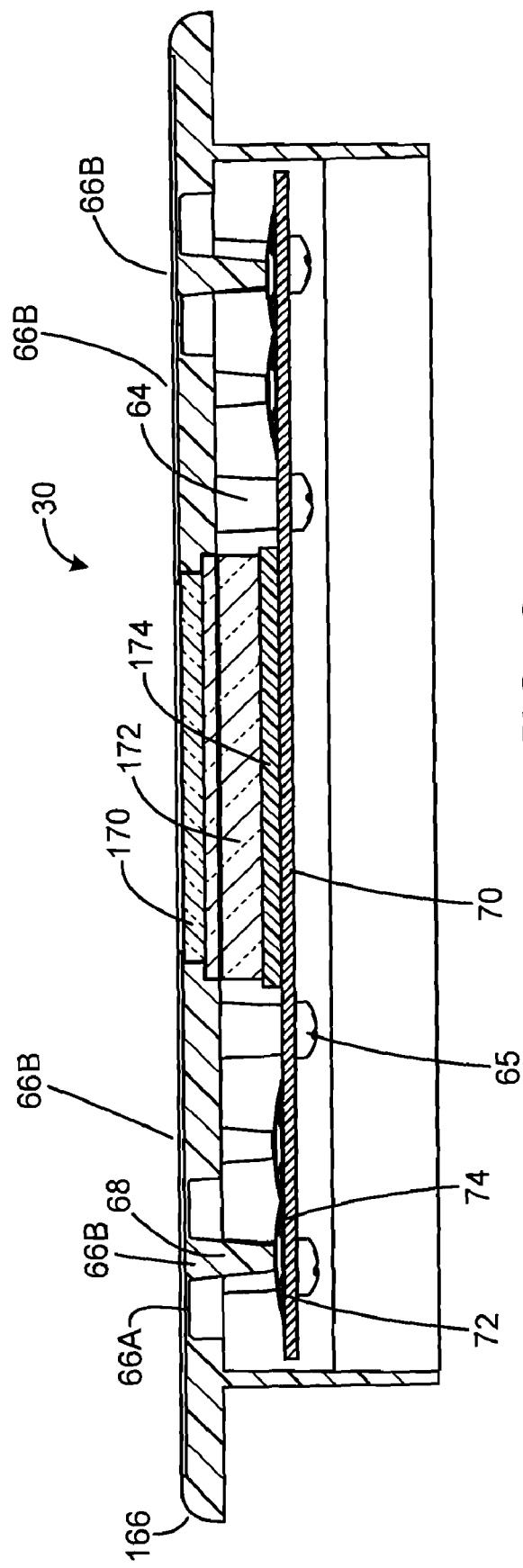
FIG. 6 is a cross-sectional front view of a control panel for a bathing installation.

FIG. 6 illustrates the control panel 30 in further detail. The control panel 30 in this example includes several inductive sensors, including actuator regions 66B as described above regarding FIGS. 1-3. Additionally, the control panel may include a display 172, visible through window 170 formed in the housing 166, for displaying indicia such as symbols and alphanumeric information such as temperature, status and error codes, and the like. The display may be implemented as an LCD or LED display, and is connected to the circuit board 70 by connections 174, e.g. pins or elastomeric connectors. The interior spaces of the housing 166 may be filled or partially filled with an encapsulation gel, as described above regarding the embodiment of FIGS. 1-3, not illustrated in FIG. 6 for simplicity.

Figure 7:
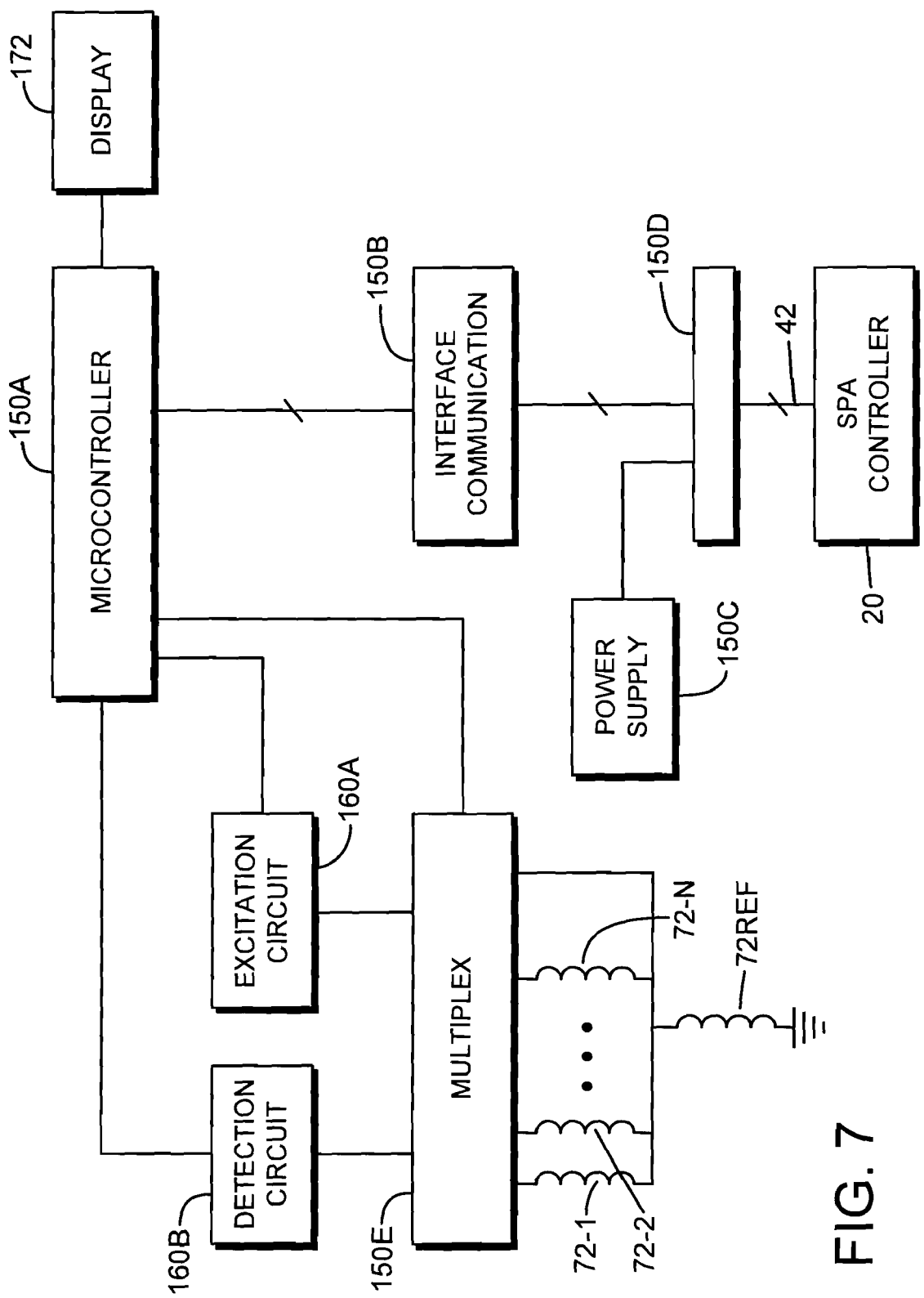
FIG. 7 is a simplified electrical schematic block diagram of a control panel for a bathing installation.

FIG. 7 illustrates a simplified electrical schematic of elements of an exemplary embodiment of a control panel circuit for a bathing installation such as a spa, utilizing inductive sensors to provide user input information. The control panel is connected through connector 150D by wiring harness 142 to a spa controller 20. A microcomputer 150A, e.g. a PIC 16F887 microcomputer marketed by Microchip Technology, Inc., is programmed to control operation of the control panel and the display 172. In this example, the microcomputer generates a square wave signal at 50% duty cycle, at 5 MHz, which is input to the excitation circuit 160A, although other frequencies may be employed in other embodiments. The excitation circuit transforms the square wave signal to a triangular waveform used as the excitation signal for the sensor coils. In this example, the control panel has a plurality of sensor buttons or actuators, each actuating a corresponding sensor coil 72-1, 72-2, ... 72-N. In one control panel example, there are six sensor actuators, and so N=6 in this example. A reference coil 72REF is also formed on the circuit board, and may be connected as shown in FIG. 7. A multiplexer circuit 150E is connected to the excitation circuit 160A and allows the excitation signal to be applied sequentially to the respective sensor coils. The multiplexer circuit is also connected to the detection circuit 160B, and is configured to provide an output signal to the microcomputer indicative of changes of inductance at each sensor, indicating an actuator push or pushes. The output signal is processed by the microcomputer 150A, and this may be used to update the display, and data representing the state of the control panel actuators can also be passed to the spa controller 20, e.g. to indicate commands entered by the user by the panel actuators.

Suitable exemplary excitation and detection circuits for use in an inductive touch sensor utilizing sensor coils are described in application notes available from Microchip technology Inc., e.g. Application note AN1237, "Inductive Touch Hardware Design," 2008, and Application note AN1241, "Inductive Touch Software Design," 2008, available at the Microchip web site noted above regarding the Microchip "Inductive Touch Resource Kit."

Figure 8:
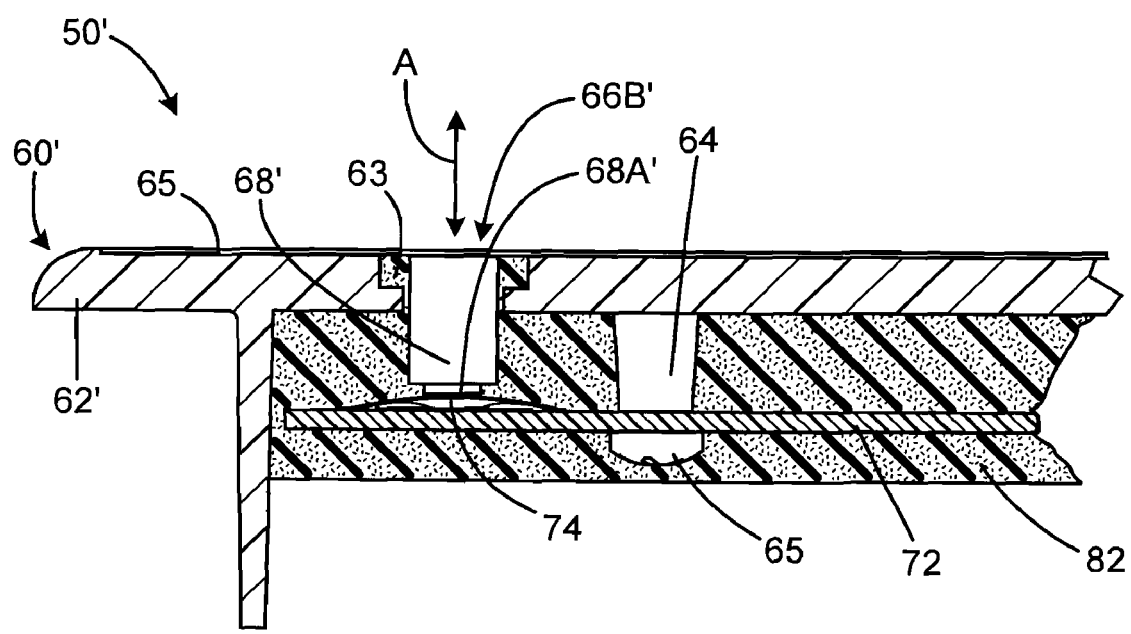
FIG. 8 is a diagrammatic side view illustrating features of an exemplary embodiment of an alternate embodiment of an inductive sensor assembly.

An alternate embodiment of a sensor assembly 50' is illustrated in FIG. 8. This embodiment is similar to that described above regarding FIG. 1, and as used in the panel of FIG. 6, as reflected by like reference numbers indicating like elements. A difference is that the actuator stem portion 68' is fabricated as a separate structure, and is positioned within an opening 63 formed in the top panel portion 62' of the housing structure 60'. A flexible membrane 65 is laminated to the top surface of the top panel portion, and overlays the opening 63 and the actuator or plunger 68', and retains the plunger 68' within the opening 63. The potting gel 84 in this exemplary embodiment extends into the region of the opening 63 surrounding the plunger 68'.

The plunger 68' protrudes downwardly into the open region of the housing structure, and in a rest position the distal end 68A' (FIG. 2) may contact without fully depressing the flexible metal domed spring structure 74. The gel and membrane 65 allow movement of the plunger 68' in relation to the top panel portion 62' as a result of a pressing force exerted by a user on the actuator area 66B'. The movement of the plunger 68' in the direction of the arrow A may be quite small, e.g. on the order of 0.01 inch in an exemplary embodiment. The domed spring structure 74 is configured to be flexed toward and without contacting the inductive sensor area on the circuit board by force exerted by the stem portion or plunger 68' when a user exerts force on the actuator area, the flexing of the domed spring structure resulting a change of inductance of the inductive sensor area to indicate an button actuator push.

Although the foregoing has been a description and illustration of specific embodiments of the subject matter, various modifications and changes thereto can be made by persons skilled in the art without departing from the scope and spirit of the invention.

What is claimed is:

1. An electrical sensor assembly, comprising:
a hollow housing structure defining an open space within the housing structure, the housing structure including a surface having an actuator area, the surface configured to permit limited flexing of the actuator area relative to the surface in response to force exerted by a user on the actuator area;
a circuit board mounted in the open space, the circuit board including an inductive sense area;
a flexible metal dome spring structure positioned over the inductive sensor area in a non-contacting relationship;
a stem portion extending from the actuator area of the housing structure and having a distal end disposed adjacent to or in contact with the spring structure;
the dome spring structure configured to be flexed toward the inductive sensor area by force exerted by the stem portion when a user exerts force on the actuator area, the flexing of the domed spring structure resulting in a change of inductance of the inductive sensor area to indicate an actuator push; and
resiliently deformable potting material substantially filling open spaces in the hollow housing structure between the top surface and the circuit board, and an open space below the circuit board, the resilient deformability of the potting material enabling flexure of the domed spring structure while providing moisture protection.

2. The sensor assembly of claim 1, wherein the inductive sensor area includes a coil formed on a top surface of the circuit board by a conductor pattern.

3. The sensor assembly of claim 1, wherein the hollow housing structure and the stem portion are fabricated as a unitary one-piece structure.

4. The sensor assembly of claim 1, wherein the housing structure and the stem portion are electrically non-conductive.

5. The sensor assembly of claim 1, wherein the dome spring structure comprises a dome portion and a plurality of contact feet portions, and wherein at least one of the contact feet portions is attached to the circuit board to locate the dome portion over the sensor area.

6. The sensor assembly of claim 5, in which the at least one of the contact feet portions of the domed spring structure is soldered to the circuit board.

7. The sensor assembly of claim 5, wherein at least one of the contact feet portions is attached to the circuit board by adhesive or tape.

8. The sensor assembly of claim 5, wherein a single one of the plurality of contact feet portions is attached to the circuit board, and each of the unattached contact feet portions are allowed to move or slide as the dome portion of the spring structure is depressed and released.

9. The sensor assembly of claim 5, wherein the resiliency of the potting material is such that the potting material is forced out from under the dome portion of the spring structure during an actuator push, and subsequently drawn back under the dome portion upon release of the actuator push.

10. An electrical sensor assembly comprising:
a housing structure defining an open space within the housing structure, the housing structure including a surface having a region of reduced thickness generally surrounding an actuator area;

a circuit board mounted to the housing structure in the open space, the circuit board including an inductive sense area;

a flexible electrically conductive spring structure attached to the circuit board over the inductive sensor area in an non-contacting relationship;

a stem member extending from the actuator area of the housing structure and having a distal end disposed adjacent to or in contact with the spring structure; and wherein the spring structure is configured to be flexed toward the inductive sensor area by force exerted by the stem portion when a user exerts force on the actuator area, the flexing of the spring structure resulting in a change of inductance of the inductive sensor area to indicate an actuator push.

11. The sensor assembly of claim 10, further comprising: resiliently deformable potting material substantially filling an open space in the hollow housing structure between the top surface and the circuit board, and an open space below the circuit board, the resilient deformability of the potting material enabling flexure of the spring structure while providing moisture protection.

12. The sensor assembly of claim 10, wherein the inductive sensor area includes a coil formed on a top surface of the circuit board by a conductor pattern.

13. The sensor assembly of claim 10, wherein the housing structure and the stem portion are fabricated as a unitary one-piece structure.

14. The sensor assembly of claim 10, wherein the housing structure and the stem portion are electrically non-conductive.

15. The sensor assembly of claim 10, wherein the spring structure comprises a dome portion and a plurality of contact feet portions, and wherein at least one of the contact feet portions is attached to the circuit board to locate the dome portion over the sensor area.

16. The sensor assembly of claim 15, in which the at least one of the contact feet portions of the domed spring structure is soldered to the circuit board.

17. The sensor assembly of claim 15, wherein at least one of the contact feet portions is attached to the circuit board by tape or adhesive.

18. The sensor assembly of claim 15, wherein at least one of the contact feet portions is attached to the circuit board by a tab portion which protrudes through the circuit board.

19. The sensor assembly of claim 15, wherein a single one of the plurality of contact feet portions is attached to the circuit board, and each of the unattached contact feet portions are allowed to move or slide as the dome portion of the spring structure is depressed and released.

20. An electrical sensor assembly comprising:
a hollow housing structure defining an open space within the housing structure;
a circuit board mounted to the housing structure in the open space, the circuit board including an inductive sense area;
a flexible metal domed spring structure attached to the circuit board over the inductive sensor area in a non-contacting relationship;
a stem member extending from an actuator area of the housing structure and having a distal end disposed adjacent to or in contact with the spring structure; and
wherein the domed spring structure is configured to be flexed toward and without contacting the inductive sensor area by force exerted by the stem portion when a user exerts force on the actuator area, the flexing of the domed spring structure resulting in a change of inductance of the inductive sensor area to indicate an actuator push.

21. The sensor assembly of claim 20, wherein the stem portion is a separate plunger member disposed within an opening formed in a top panel portion of the housing structure, and the sensor assembly further comprises a flexible membrane attached to the top panel portion and overlaying the opening.

22. The sensor assembly of claim 21, further comprising: resiliently deformable potting material substantially filling an open space in the hollow housing structure between the top surface and the circuit board, and an open space below the circuit board, the resilient deformability of the potting material enabling flexure of the domed spring structure while providing moisture protection, the potting material further disposed in the opening formed in the top panel portion surrounding the plunger member.

23. A control panel for a bathing installation, comprising:
a hollow housing structure defining an open space within the housing structure and a panel surface;
an electronic display for displaying information regarding the bathing installation;
a plurality of actuator regions on the panel surface for conveying user commands to provide or adjust parameter settings of the bathing installation or to control the panel;
wherein the panel surface is a generally rigid surface permitting limited flexing of said actuator regions in response to force exerted by a user on the actuator regions;
a circuit board mounted in the open space, the circuit board including an inductive sense area for each actuator region;
a flexible metal dome spring structure positioned over each inductive sensor area in a non-contacting relationship;
a stem portion extending from each actuator region of the housing structure and having a distal end disposed adjacent to or in contact with a corresponding spring structure;
each dome spring structure configured to be flexed toward the inductive sensor area by force exerted by the stem portion when a user exerts force on the actuator region, the flexing of the domed spring structure resulting in a change of inductance of the inductive sensor area to indicate a actuator push; and
resiliently deformable potting material substantially filling open spaces in the hollow housing structure between the top surface and the circuit board, and an open space below the circuit board, the resilient deformability of the potting material enabling flexure of the domed spring structure while providing moisture protection.

24. The control panel of claim 23, wherein the electronic display is mounted to the circuit board.

25. The control panel of claim 23, wherein the housing structure and each said stem portion are fabricated as a unitary one-piece structure from an electrically non-conductive material.

26. The control panel of claim 23, wherein each said dome spring structure comprises a dome portion and a plurality of contact feet portions, and wherein at least one of the contact feet portions is attached to the circuit board to support the dome portion over the sensor area.

27. The control panel of claim 26, wherein a single one of the plurality of contact feet portions is attached to the circuit board, and each of the unattached contact feet portions are allowed to move or slide as the dome portion of the spring structure is depressed and released.

28. The control panel of claim 23, wherein each said stem portion is a separate plunger member disposed within a corresponding opening formed in a top panel portion of the housing structure, and the sensor assembly further comprises a flexible membrane attached to the top panel portion and overlaying each said opening.

\* \* \* \* \*